(12) United States Patent
Mok et al.

(10) Patent No.: US 9,921,448 B2
(45) Date of Patent: Mar. 20, 2018

(54) DISPLAY DEVICE

(71) Applicant: Samsung Display Co., Ltd., Yongin-si (KR)

(72) Inventors: Seonkyoon Mok, Hwaseong-si (KR); Seongyoung Lee, Hwaseong-si (KR); Kiwon Park, Asan-si (KR); Hyungjun Park, Seongnam-si (KR); Hwanyoung Jang, Daegu (KR); Byoungsun Na, Seoul (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 15/425,034

(22) Filed: Feb. 6, 2017

(65) Prior Publication Data

US 2017/0343875 A1    Nov. 30, 2017

(30) Foreign Application Priority Data

May 25, 2016    (KR) ........................ 10-2016-0064135

(51) Int. Cl.
| | |
|---|---|
| *H01L 27/12* | (2006.01) |
| *G02F 1/1362* | (2006.01) |
| *G02F 1/1343* | (2006.01) |
| *G02F 1/1368* | (2006.01) |
| *G02F 1/1335* | (2006.01) |
| *G02F 1/1333* | (2006.01) |

(52) U.S. Cl.
CPC ...... *G02F 1/136286* (2013.01); *G02F 1/1368* (2013.01); *G02F 1/13439* (2013.01); *G02F 1/134309* (2013.01); *G02F 1/136213* (2013.01); *G02F 1/136227* (2013.01); *H01L 27/124* (2013.01); *H01L 27/1255* (2013.01); *G02F 1/133345* (2013.01); *G02F 1/133512* (2013.01); *G02F 1/133514* (2013.01); *G02F 1/133528* (2013.01); *G02F 2201/121* (2013.01); *G02F 2201/123* (2013.01)

(58) Field of Classification Search
CPC . H01L 27/286; H01L 27/30; H01L 29/66007; H01L 29/66227; H01L 29/66409
See application file for complete search history.

(56) References Cited

U.S. PATENT DOCUMENTS

| | | |
|---|---|---|
| 2006/0274254 A1 | 12/2006 | Yan |
| 2011/0157527 A1 | 6/2011 | Jo et al. |
| 2012/0268679 A1 | 10/2012 | Song et al. |
| 2014/0313447 A1 | 10/2014 | Song et al. |

FOREIGN PATENT DOCUMENTS

| | | |
|---|---|---|
| KR | 10-2008-0053710 | 6/2008 |
| KR | 10-2011-0070476 | 6/2011 |

*Primary Examiner* — Cheung Lee
(74) *Attorney, Agent, or Firm* — H.C. Park & Associates, PLC

(57) ABSTRACT

A display device capable of significantly reducing variation of a capacitance formed by a pixel electrode and a data line, the display device including: a first gate line; first and second data lines intersecting the first gate line; a pixel electrode adjacent to the second data line; a switching element connected to the first gate line, the first data line, and the pixel electrode; and a first extension portion extending from the pixel electrode and intersecting the second data line.

27 Claims, 10 Drawing Sheets

DISPLAY DEVICE

CROSS-REFERENCE TO RELATED APPLICATION

This application claims priority from and the benefit of Korean Patent Application No. 10-2016-0064135, filed on May 25, 2016, which is hereby incorporated by reference for all purposes as if fully set forth herein.

BACKGROUND

Field

Exemplary embodiments relate to a display device. More particularly, exemplary embodiments relate to a display device capable of significantly reducing capacitance variation between a pixel electrode and a data line.

Discussion of the Background

Liquid crystal display (LCD) devices are one of most widely used types of flat panel display (FPD) devices. An LCD device includes two substrates including two electrodes respectively formed thereon, and a liquid crystal layer interposed therebetween. Upon applying voltage to the two electrodes, liquid crystal molecules of the liquid crystal layer are rearranged such that an amount of transmitted light is controlled in the LCD device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of significantly reducing variation of a capacitance between a pixel electrode and a data line.

Additional aspects will be set forth in the detailed description which follows, and, in part, will be apparent from the disclosure, or may be learned by practice of the inventive concept.

An exemplary embodiment discloses a display device including: a first gate line; first and second data lines intersecting the first gate line; a pixel electrode adjacent to the second data line; a switching element connected to the first gate line, the first data line, and the pixel electrode; and a first extension portion extending from the pixel electrode and intersecting the second data line.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
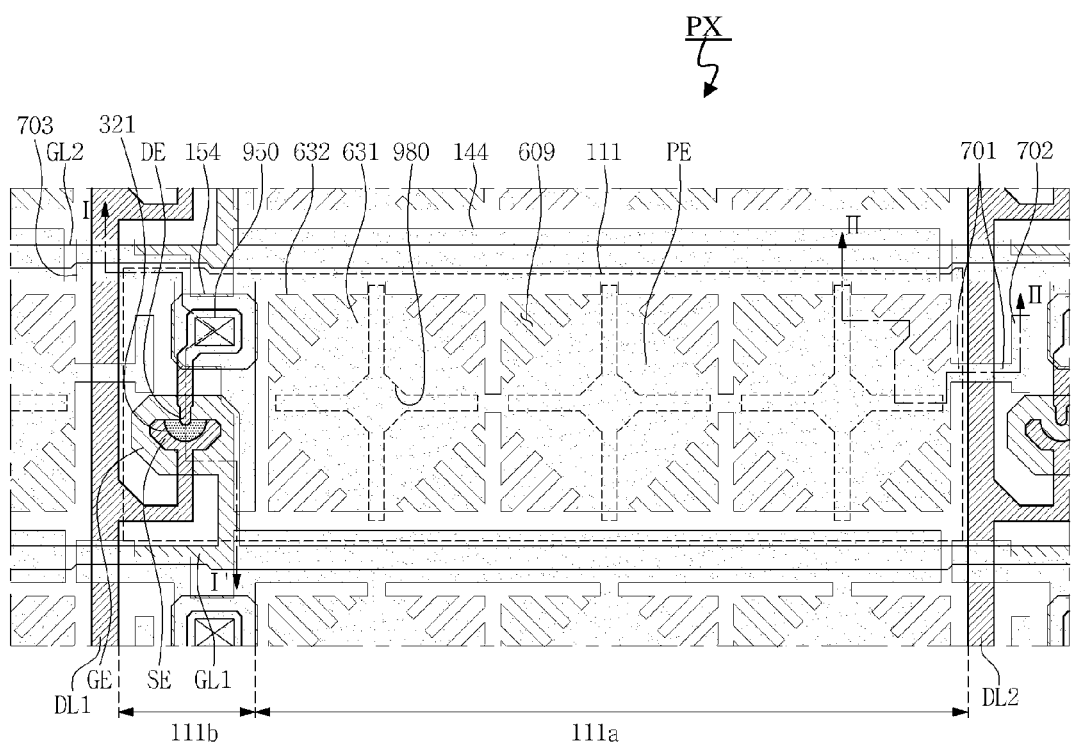
FIG. 1 is a plan view illustrating an exemplary embodiment of a display device.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
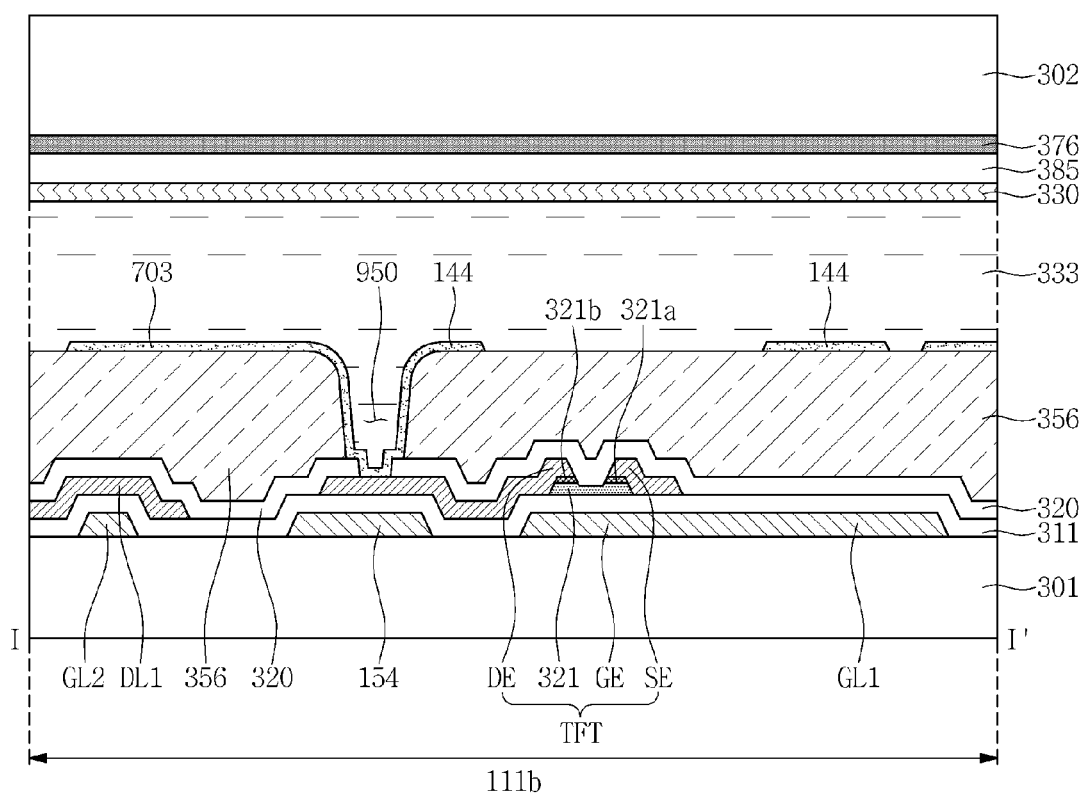
FIG. 2 is a cross-sectional view taken along line I-I' of FIG. 1.

FIG. 1 is a plan view illustrating an exemplary embodiment of a display device of the inventive concept; FIG. 2 is a cross-sectional view taken along line I-I' of FIG. 1; and FIG. 3 is a cross-sectional view taken along line II-IT of FIG. 1.

An exemplary embodiment of a display device of the inventive concept includes a plurality of gate lines, a plurality of data lines, and a plurality of pixels. Each of the pixels is connected to a corresponding one of the gate lines and a corresponding one of the data lines.

FIG. 1 illustrates one of a plurality of pixels PX provided in a liquid crystal display ("LCD") device, and gate lines GL1 and GL2 and data lines DL1 and DL2 disposed adjacent to the pixel PX. In addition, FIG. 1 illustrates portions of other pixels adjacent thereto in the vicinity of the pixel PX.

Figure 3:
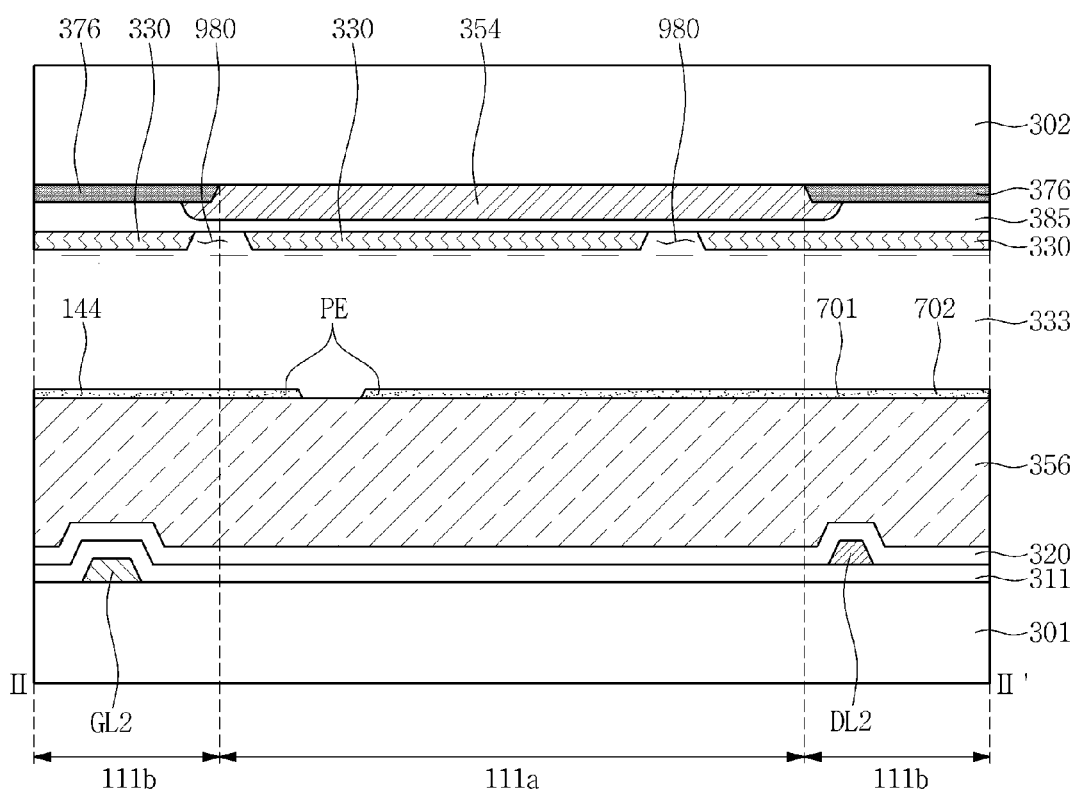
FIG. 3 is a cross-sectional view taken along line II-IT of FIG. 1.

As illustrated in FIGS. 1, 2, and 3, the pixel PX includes a first substrate 301, a switching element TFT, a gate insulating layer 311, a passivation layer 320, an insulating interlayer 356, a pixel electrode PE, a second substrate 302, a light blocking layer 376, a color filter 354, an overcoat layer 385, a common electrode 330, and a liquid crystal layer 333. In an exemplary embodiment, although not illustrated, the pixel PX may further include a first polarizer and a second polarizer. In a case where a surface of the first substrate 301 and a surface of the second substrate 302 that face each other are defined as upper surfaces of the corresponding substrates, respectively, and surfaces opposite to the upper surfaces are defined as lower surfaces of the corresponding substrates, respectively, the aforementioned first polarizer is disposed on the lower surface of the first substrate 301, and the second polarizer is disposed on the lower surface of the second substrate 302.

A transmission axis of the first polarizer is perpendicular to a transmission axis of the second polarizer, and one of the transmission axes thereof is oriented parallel to the gate lines GL1 and GL2. In another exemplary embodiment, the LCD device may only include one of the first polarizer and the second polarizer.

The pixel PX is connected to the first gate line GL1 and the first data line DL1. For example, the pixel PX is connected to the first gate line GL1 and the first data line DL1 through the switching element TFT. In an exemplary embodiment, other pixels, not illustrated in the drawings, are connected to the second gate line GL2 and the second data line DL2. In a single frame period, the second gate line GL2 is driven prior to the first gate line GL1.

The switching element TFT and the pixel electrode PE of the pixel PX are disposed in a pixel area 111 of the pixel PX. The pixel area 111 of the pixel PX is an area defined by the first gate line GL1, the second gate line GL2, the first data line DL1, and the second data line DL2 that are adjacent to one another. In other words, an area surrounded by the first gate line GL1, the second gate line GL2, the first data line DL1, and the second data line DL2 is the aforementioned pixel area 111.

The pixel area 111 includes a light emission area 111a and a light blocking area 111b. The light blocking area 111b is covered by the light blocking layer 376. In an exemplary embodiment, the light blocking layer 376 may be absent from the light emission area 111a. The switching element TFT is disposed in the light blocking area 111b, and the pixel electrode PE is disposed in the light emission area 111a.

The switching element TFT includes a semiconductor layer 321, a gate electrode GE, a source electrode SE, and a drain electrode DE. The gate electrode GE is connected to the first gate line GL1, the source electrode SE is connected to the first data line DL1, and the drain electrode DE is connected to the pixel electrode PE. The drain electrode DE and the pixel electrode PE may be connected to each other through a connection electrode 144.

The switching element TFT may be a thin film transistor ("TFT").

The gate electrode GE, the first gate line GL1, and the second gate line GL2 are disposed on the first substrate 301.

The gate electrode GE may have a shape protruding toward the second gate line GL2 from the first gate line GL1. The gate electrode GE is disposed between the first gate line GL1 and the second gate line GL2. The gate electrode GE and the first gate line GL1 may be integrally formed as a single structure.

The gate electrode GE may include or be formed of aluminum (Al) or alloys thereof, silver (Ag) or alloys thereof, copper (Cu) or alloys thereof, and/or molybdenum (Mo) or alloys thereof. In another exemplary embodiment, the gate electrode GE may include or be formed of one of chromium (Cr), tantalum (Ta), and titanium (Ti). In an exemplary embodiment, the gate electrode GE may have a multilayer structure including at least two conductive layers that have different physical properties from one another.

Although not illustrated, an end portion of the first gate line GL1 may be connected to another layer or an external driving circuit. The end portion of the first gate line GL1 may have a larger planar area than a planar area of another portion of the first gate line GL1. The first gate line GL1 may include substantially the same material and may have substantially the same structure (e.g., a multilayer structure) as those of the gate electrode GE. The first gate line GL1 and the gate electrode GE may be simultaneously provided by the same process.

The second gate line GL2 may have substantially a same structure as a structure of the first gate line GL1. The second gate line GL2 is driven prior to the first gate line GL1. For example, the second gate line GL2 is driven before the first gate line GL1 is driven in a single frame period. To this end, a gate signal required to drive the second gate line GL2 may be output prior to a gate signal required to drive the first gate line GL1, in a single frame period.

As illustrated in FIGS. 2 and 3, the gate insulating layer 311 is disposed on the first substrate 301, the gate electrode GE, the first gate line GL1, and the second gate line GL2. In such an exemplary embodiment, the gate insulating layer 311 may be disposed over an entire surface of the first substrate 301 including the gate electrode GE, the first gate line GL1, and the second gate line GL2.

The gate insulating layer 311 may include or be formed of silicon nitride ($SiN_x$) or silicon oxide ($SiO_x$). The gate insulating layer 311 may have a multilayer structure including at least two insulating layers having different physical properties.

As illustrated in FIG. 2, the semiconductor layer 321 is disposed on the gate insulating layer 311. As illustrated in FIG. 2, the semiconductor layer 321 overlaps at least a portion of the gate electrode GE.

The semiconductor layer 321 may include amorphous silicon, polycrystalline silicon, or the like. In addition, the semiconductor layer 321 may include or be formed of one of polycrystalline silicon and/or an oxide semiconductor, such as indium gallium zinc oxide (IGZO) or indium zinc tin oxide (IZTO).

The source electrode SE is disposed on the gate insulating layer 311 and the semiconductor layer 321. The source electrode SE overlaps the semiconductor layer 321 and the gate electrode GE. The source electrode SE may have a shape protruding from the first data line DL1 toward the gate electrode GE. The source electrode SE and the first data line DL1 may be integrally formed as a single structure. Although not illustrated, the source electrode SE may be a portion of the first data line DL1.

The source electrode SE may have one of an I shape, a C shape, and a U shape, for example. FIG. 1 illustrates a source electrode SE having a U shape, and a convex portion of the source electrode SE faces toward the first gate line GL1 which is disposed in a lower portion of the pixel.

The source electrode SE may include or be formed of a refractory metal, such as molybdenum, chromium, tantalum, titanium, and/or an alloy thereof. The source electrode SE may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, the source electrode SE may include, or be formed of, any suitable metals and/or conductors rather than the aforementioned materials.

As illustrated in FIG. 2, the first data line DL1 is disposed on the gate insulating layer 311. Although not illustrated, an end portion of the first data line DL1 may be connected to another layer or an external driving circuit. The end portion of the first data line DL1 may have a larger planar area than a planar area of another portion of the first data line DL1. The first data line DL1 may include substantially the same material and may have substantially the same structure (e.g., a multilayer structure) as those of the source electrode SE. The first data line DL1 and the source electrode SE may be simultaneously provided by the same process.

The first data line DL1 intersects the first gate line GL1 and the second gate line GL2. A portion of the data line intersecting the gate line may have a line width less than a line width of another portion of the data line, and a portion of the gate line intersecting the data line may have a line width less than a line width of another portion of the gate line. For example, a portion of the first data line DL1 intersecting the first gate line GL1 may have a line width less than a line width of another portion of the first data line DL1, and a portion of the first gate line GL1 intersecting the first data line DL1 may have a line width less than a line width of another portion of the first gate line GL1. Accordingly, a parasitic capacitance among each of the data lines DL1 and DL2 and each of the gate lines GL1 and GL2 may be reduced.

The drain electrode DE is disposed on the gate insulating layer 311 and the semiconductor layer 321, and is spaced apart from the source electrode SE by a predetermined distance. The drain electrode DE overlaps the semiconductor layer 321 and the gate electrode GE. A channel area of the switching element is positioned between the drain electrode DE and the source electrode SE.

The drain electrode DE is connected to the pixel electrode PE. The drain electrode DE may be connected to the pixel electrode PE through the connection electrode 144. The drain electrode DE overlaps the connection electrode 144. In such an exemplary embodiment, the drain electrode DE and the connection electrode 144 are electrically connected to each other through a contact hole 950.

The drain electrode DE may include substantially the same material and may have substantially the same structure (e.g., a multilayer structure) as those of the source electrode SE. The drain electrode DE and the source electrode SE may be simultaneously provided by the same process.

A first ohmic contact layer 321a is disposed between the semiconductor layer 321 and the source electrode SE. The first ohmic contact layer 321a reduces an interfacial resistance between the semiconductor layer 321 and the source electrode SE.

The first ohmic contact layer 321a may include silicide or n+ hydrogenated amorphous silicon doped with n-type impurity ions, e.g., phosphorus (P) or phosphine (PH$_3$), at high concentration.

A second ohmic contact layer 321b is disposed between the semiconductor layer 321 and the drain electrode DE. The second ohmic contact layer 321b reduces an interfacial resistance between the semiconductor layer 321 and the drain electrode DE. The second ohmic contact layer 321b may include substantially the same material and may have substantially the same structure (e.g., a multilayer structure) as those of the aforementioned first ohmic contact layer 321a. The second ohmic contact layer 321b and the first ohmic contact layer 321a may be simultaneously provided by substantially the same process.

Although not illustrated, the semiconductor layer 321 may further be disposed between the gate insulating layer 311 and the source electrode SE. In addition, the semiconductor layer 321 may further be disposed between the gate insulating layer 311 and the drain electrode DE. In such an exemplary embodiment, the semiconductor layer between the gate insulating layer 311 and the source electrode SE is defined as a first additional semiconductor layer, and the semiconductor layer between the gate insulating layer 311 and the drain electrode DE is defined as a second additional semiconductor layer. In such an exemplary embodiment, the aforementioned first ohmic contact layer 321a may further be disposed between the first additional semiconductor layer and the source electrode SE, and the aforementioned second ohmic contact layer 321b may further be disposed between the second additional semiconductor layer and the drain electrode DE.

In addition, although not illustrated, the semiconductor layer 321 may further be disposed between the gate insulating layer 311 and each of the data lines DL1 and DL2. For example, the semiconductor layer 321 may further be disposed between the gate insulating layer 311 and the first data line DL1. Herein, the semiconductor layer between the gate insulating layer 311 and the first data line DL1 is defined as a third additional semiconductor layer. In such an exemplary embodiment, the aforementioned first ohmic contact layer 321a may further be disposed between the third additional semiconductor layer and the first data line DL1.

As illustrated in FIGS. 2 and 3, the passivation layer 320 is disposed on each of the data lines DL1 and DL2, the source electrode SE, the drain electrode DE, and the gate insulating layer 311. In such an exemplary embodiment, the passivation layer 320 may be disposed over the entire surface of the first substrate 301, including each of the data lines DL1 and DL2, the source electrode SE, the drain electrode DE, and the gate insulating layer 311. The passivation layer 320 has a first hole defined on the drain electrode DE.

The passivation layer 320 may include an inorganic insulating material such as silicon nitride (SiN$_x$) or silicon oxide (SiO$_x$), and in such an exemplary embodiment, an inorganic insulating material having some degree of photosensitivity and having a dielectric constant of about 4.0 may be used. In another exemplary embodiment, the passivation layer 320 may have a double-layer structure including a lower inorganic layer and an upper organic layer, which is found to impart excellent insulating characteristics and not to damage an exposed portion of the semiconductor layer 321. The passivation layer 320 may have a thickness greater than or equal to about 5000 Å, e.g., in a range of about 6000 Å to about 8000 Å.

As illustrated in FIGS. 2 and 3, the insulating interlayer 356 is disposed on the passivation layer 320. The insulating interlayer 356 has a second hole disposed above the first hole. The second hole is larger than the first hole.

The insulating interlayer 356 may include an organic layer having a low dielectric constant. For example, the insulating interlayer 356 may include a photosensitive organic material having a dielectric constant lower than that of the passivation layer 320.

The pixel electrode PE, the connection electrode 144, the first extension portion 701, the second extension portion 702, and the third extension portion 703 are disposed on the insulating interlayer 356.

The pixel electrode PE is connected to the drain electrode DE through the connection electrode 144. The connection electrode 144 is connected to the drain electrode DE through the contact hole 950.

The contact hole 950 includes the first hole of the passivation layer 320 and the second hole of the insulating interlayer 356. A portion of the drain electrode DE is exposed through the contact hole 950. In such an exemplary embodiment, the holes of the contact hole 950 have a progressively larger size as in the upward direction, and accordingly, the connection electrode 144 at an inner wall of the contact hole 950 may include a plurality of curved portions. Accordingly, damage to the connection electrode 144 in the contact hole 950, which has a large depth, may be prevented. For example, a cut in the connection electrode 144 may be prevented.

One of sides of the pixel electrode PE that faces the gate line has a length greater than a length of another of the sides of the pixel electrode PE that faces the data line. For example, one of four sides included in the pixel electrode PE that faces the first gate line GL1 has a length greater than a length of another of the four sides included in the pixel electrode PE that faces the second data line DL2.

The pixel electrode PE and the second data line DL2 are spaced apart from each other in a horizontal direction, and a first capacitor is formed between the pixel electrode PE and the second data line DL2.

The pixel electrode PE may include a transparent conductive material, e.g., indium tin oxide (ITO) or indium zinc oxide (IZO). In such an exemplary embodiment, for example, ITO may include a polycrystalline material or a monocrystalline material, and IZO may include a polycrystalline material or a monocrystalline material. Alternatively, IZO may include an amorphous material.

Figure 4:
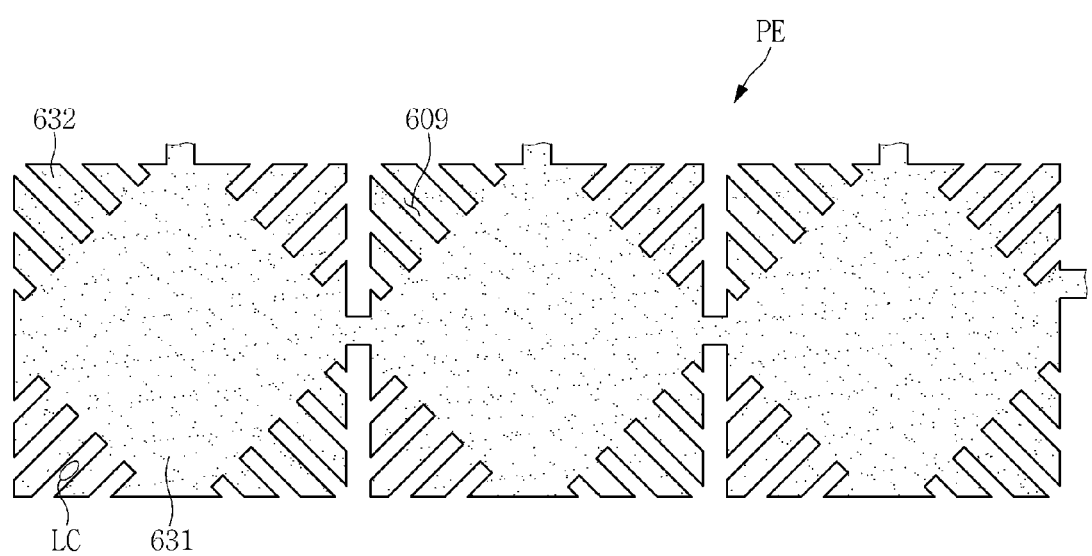
FIG. 4 is a plan view separately illustrating a pixel electrode in a light emission area of FIG. 1.

FIG. 4 is a view separately illustrating the pixel electrode PE in the light emission area 111a of FIG. 1.

As illustrated in FIG. 4, the pixel electrode PE includes a planar electrode 631 and a branch electrode 632.

The planar electrode 631 may have a quadrangular shape. For example, as illustrated in FIG. 4, the planar electrode 631 may have a lozenge shape.

The branch electrode 632 extends from the planar electrode 631. For example, the branch electrode 632 may extend from at least one side of the planar electrode 631. In such an exemplary embodiment, the branch electrode 632 may extend in a direction perpendicular to a side of the planar electrode 631.

A single planar electrode 631 may have a plurality of sides, and a plurality of branch electrodes 632 may extend from each of the sides of the planar electrode 631. At least two of the plurality of branch electrodes 632 extending from one side of the planar electrode 631 may have different lengths. For example, the branch electrodes 632 extending from one side of the planar electrode 631 may have a smaller length, as further away from a central portion of the one side. In other words, one of the branch electrodes 632, extending from one side of the planar electrode 631, which is disposed at a central portion of the one side, has the longest length, and an outermost one of the branch electrodes 632 extending from the one side of the planar electrode 631 has the smallest length.

A space between adjacent ones of the branch electrodes 632 is defined as a slit 609, and a major axis of liquid crystals LC is determined by the slit 609. That is, the major axis of the liquid crystals LC faces toward a length direction of the slit 609.

As illustrated in FIG. 4, a plurality of planar electrodes 631 may be disposed in a single light emission area 111a, and adjacent ones of the planar electrodes 631 may be connected to one another. Each of the planar electrodes 631 includes at least one branch electrode 632 described hereinabove.

As illustrated in FIGS. 1 and 3, the connection electrode 144 overlaps the second gate line GL2. A storage capacitor is formed between the connection electrode 144 and the second gate line GL2.

In addition, as illustrated in FIGS. 1 and 2, the connection electrode 144 may overlap the gate electrode GE protruding from the first gate line GL1.

The connection electrode 144 may include substantially the same material and have substantially the same structure as those of the pixel electrode PE. The connection electrode 144 and the pixel electrode PE may be simultaneously formed by substantially the same process.

As illustrated in FIGS. 1 and 3, the first extension portion 701 extends from the pixel electrode PE and intersects the second data line DL2. The first extension portion 701 may perpendicularly intersect the second data line DL2.

As illustrated in FIG. 1, in a case where the plurality of planar electrodes 631 are provided in a single light emission area 111a, the first extension portion 701 may extend from a planar electrode that is most adjacent to the second data line DL2 among the plurality of planar electrodes 631. The first extension portion 701 may extend from the planar electrode 631. In another exemplary embodiment, the first extension portion 701 may extend from the branch electrode 632.

The second extension portion 702 extends from the first extension portion 701. The second extension portion 702 may extend in a direction parallel to the second data line DL2. The second extension portion 702 faces the second data line DL2. The second extension portion 702 faces one side of the second data line DL2, and the second extension portion 702 has a length less than a length of one side of the second data line DL2.

The second extension portion 702 and the second data line DL2 are spaced apart from each other in a horizontal direction, and a second capacitor is formed between the second extension portion 702 and the second data line DL2.

The second extension portion 702 of the pixel PX is disposed in another pixel that is adjacent to the pixel PX. For example, the second extension portion 702 of the pixel PX is disposed in a light blocking area of the pixel that is adjacent to the pixel PX, having the second data line DL2 therebetween.

The second extension portion 702 may include substantially the same material and have substantially the same structure as those of the pixel electrode PE. The second extension portion 702 and the pixel electrode PE may be simultaneously formed by substantially the same process.

As illustrated in FIGS. 1 and 2, the third extension portion 703 extends from the connection electrode 144. The third extension portion 703 overlaps the first data line DL1. The third extension portion 703 may have a greater width than a width of the first data line DL1. The third extension portion 703 may further overlap the second gate line GL2.

The third extension portion 703 may include substantially the same material and have substantially the same structure as those of the pixel electrode PE. The third extension portion 703 and the pixel electrode PE may be simultaneously formed by substantially the same process.

As illustrated in FIGS. 2 and 3, the light blocking layer 376 is disposed on the second substrate 302. The light blocking layer 376 overlaps the light blocking area 111b, the first gate line GL1, the second gate line GL2, the first data line DL1, and the second data line DL2. In other words, the light blocking layer 376 overlaps a light blocking area of each pixel, each of the gate lines, and each of the data lines. The light blocking layer 376 may be disposed on the first substrate 301, not on the second substrate 302. The light blocking layer 376 may include a black photosensitive resin.

The color filter 354 is disposed on the second substrate 302, corresponding to the light emission area 111a. An edge of the color filter 354 may be disposed on the light blocking layer 376. The color filter 354 may be one of a red color filter, a green color filter, a blue color filter, and a white color filter. The color filter 354 may be disposed on the first substrate 301, not on the second substrate 302. The color filter 354 may include a photosensitive resin having the aforementioned color (one of red, green, blue, and white colors).

The overcoat layer 385 is disposed on the light blocking layer 376 and the color filter 354. In such an exemplary embodiment, the overcoat layer 385 may be disposed over an entire surface of the second substrate 302 including the light blocking layer 376 and the color filter 354.

The overcoat layer 385 may help significantly reduce (e.g., minimize) a height difference among elements between the overcoat layer 385 and the second substrate 302, e.g., among elements of the second substrate 302 such as the aforementioned light blocking layer 376 and the color filter 354. In addition, the overcoat layer 385 prevents external leakage of a pigment of the color filter 354.

The common electrode 330 is disposed on the overcoat layer 385. The common electrode 330 has a hole 980. As illustrated in FIG. 1, the hole 980 has an overall cross shape. In such an exemplary embodiment, a central portion of the cross-shaped hole 980 may have a lozenge shape. That is, four inner walls of the central portion of the cross-shaped hole 980 may form a lozenge shape.

The hole 980 of the common electrode 330 may be positioned corresponding to the pixel electrode PE. For example, the hole 980 of the common electrode 330 may be positioned corresponding to the planar electrode 631. In such an exemplary embodiment, the central portion of the cross-shaped hole 980 is positioned at the central portion of the planar electrode 631. The four inner walls of the central portion correspond to four sides of the planar electrode 631. The inner walls of the central portion and the sides of the planar electrode 631, corresponding to one another, are substantially parallel to one another, respectively.

In an exemplary embodiment, although not illustrated, the common electrode 330 may have a cross shape. In such an exemplary embodiment, the cross-shaped common electrodes are connected to one another.

As illustrated in FIGS. 1 and 2, an exemplary embodiment of a display device may further include a shielding layer 154. The shielding layer 154 is disposed on the first substrate 301. For example, the shielding layer 154 is disposed corresponding to a connection portion between the drain electrode DE and the connection electrode 144. In other words, the shielding layer 154 is disposed between the first substrate 301 and the gate insulating layer 311, corresponding to the contact hole 950.

In an exemplary embodiment, as illustrated in FIGS. 1 and 2, the shielding layer 154 may further overlap the connection electrode 144.

The shielding layer 154 is not applied with any signal, and is not directly connected to any line. In other words, the shielding layer 154 is in a floating state. To this end, the shielding layer 154 does not contact any of the aforementioned conductors (e.g., the gate line, the gate electrode, the data line, the source electrode, the drain electrode, and the pixel electrode).

In a case where the aforementioned second additional semiconductor layer is provided below the drain electrode DE, the shielding layer 154 prevents light provided from a backlight unit from being irradiated to a portion of the second additional semiconductor layer overlapping the contact hole 950.

The shielding layer 154 may include substantially the same material and have substantially the same structure (a multilayer structure) as those of the gate electrode GE. The shielding layer 154 and the gate electrode GE may be simultaneously formed by substantially the same process.

Figure 5:
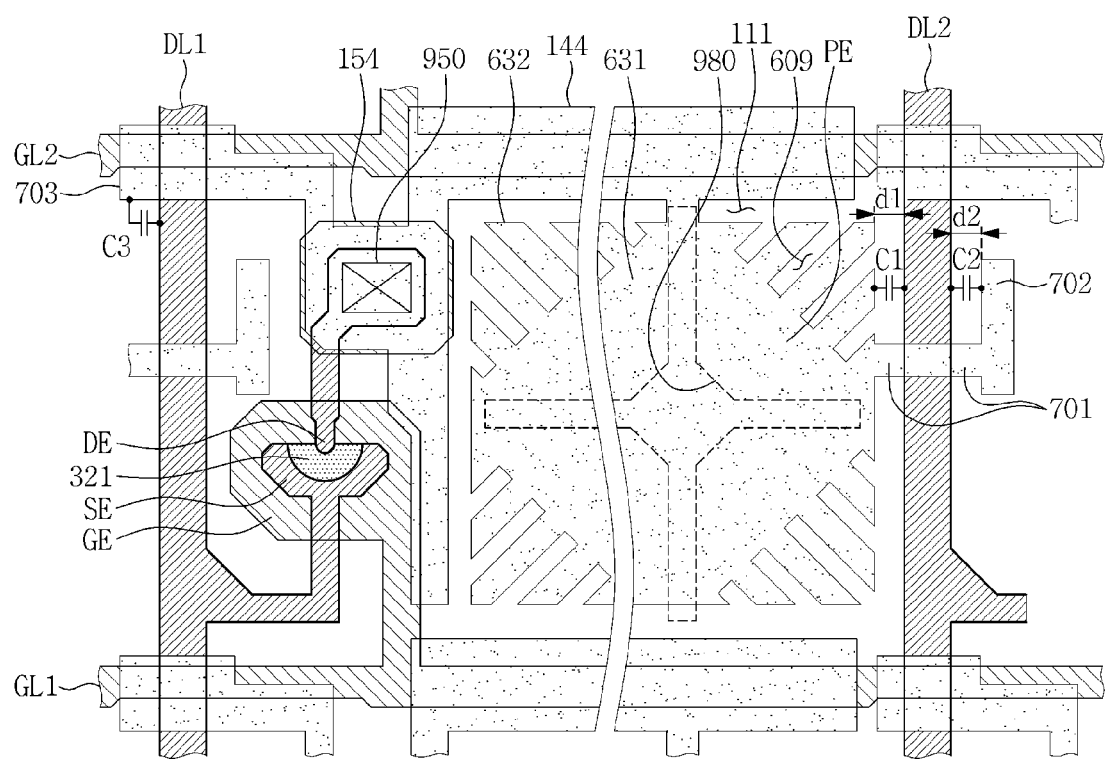
FIG. 5 is an enlarged plan view illustrating a first extension portion, a second extension portion, and a third extension portion connected to a pixel electrode, illustrated in FIG. 1, and a peripheral area thereof.

FIG. 5 is an enlarged plan view illustrating the first extension portion 701, the second extension portion 702, and the third extension portion 703 connected to the pixel electrode PE, illustrated in FIG. 1, and a peripheral area thereof.

As illustrated in FIG. 5, a first capacitor C1 is formed between a side of the second data line DL2 and the pixel electrode PE, a second capacitor C2 is formed between another side of the second data line DL2 and the second extension portion 702, and a third capacitor C3 is formed between the first data line DL1 and the third extension portion 703.

Each of the first capacitor C1 and the second capacitor C2 is a capacitor among elements that are disposed in a horizontal direction, and the third capacitor C3 is a capacitor among elements that are disposed in a vertical direction.

A capacitance of the first capacitor C1, a capacitance of the second capacitor C2, and a capacitance of the third capacitor C3 have a relationship shown in the following Mathematical Formula 1:

$$C_{C3} = C_{C1} + C_{C2}$$ [Mathematical Formula 1]

In the Mathematical Formula 1, "$C_{C1}$" denotes a capacitance of the first capacitor C1, "$C_{C2}$" denotes a capacitance of the second capacitor C2, and "$C_{C3}$" denotes a capacitance of the third capacitor C3. As such, a sum of the capacitance $C_{C1}$ of the first capacitor C1 and the capacitance $C_{C2}$ of the second capacitor C2 is substantially equal to the capacitance $C_{C3}$ of the third capacitor C3.

In an exemplary embodiment, a transparent conductive material is patterned to simultaneously form the pixel electrode, the connection electrode, the first extension portion, the second extension portion, and the third extension portion. In such an exemplary embodiment, in a case where a mask is not precisely aligned in a photolithography process which is performed on the transparent conductive material, the pixel electrode, the connection electrode, the first extension portion, the second extension portion, and the third extension portion may each be located a small distance away from desired positions. However, the relationship of the Mathematical Formula 1 is still satisfied in such an example, and thus, capacitance variation substantially does not exist, which will be described in detail with reference to accompanying drawings.

In FIG. 5, a distance d1 between the second data line DL2 and the pixel electrode PE may be substantially the same as a distance d2 between the second data line DL2 and the second extension portion 702.

Figure 6A:
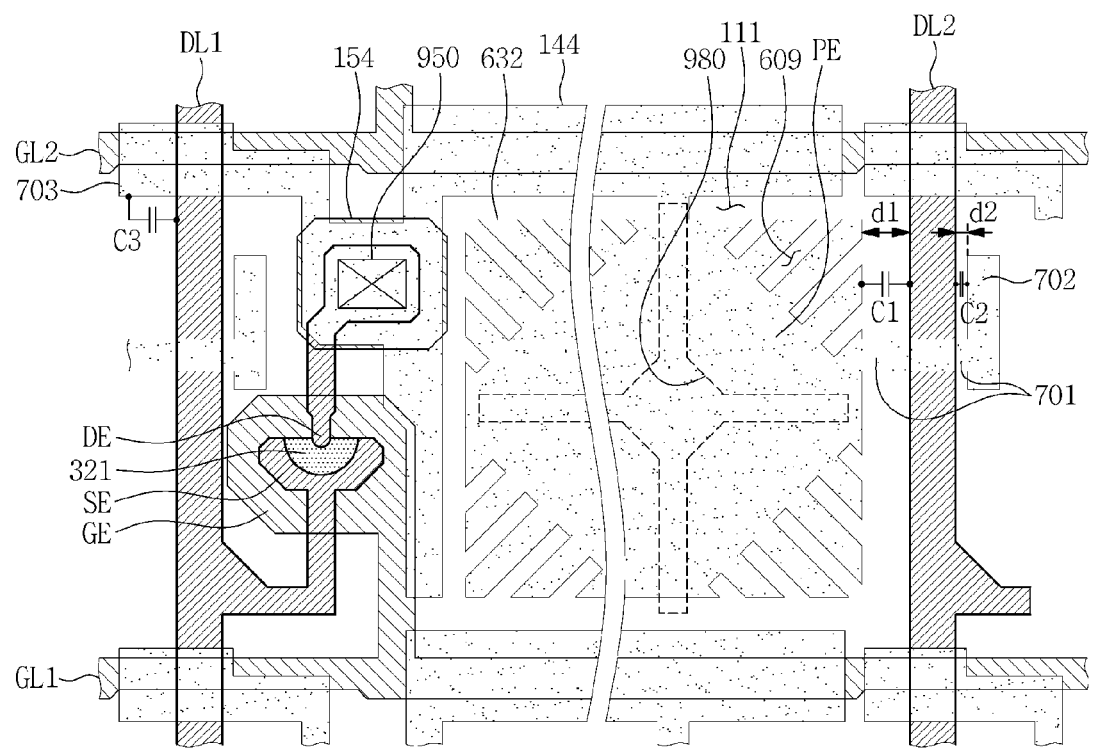
FIG. 6A is a plan view illustrating a result of the pixel electrode, a connection electrode, the first extension portion, the second extension portion, and the third extension portion, illustrated in FIG. 5, being shifted leftwards due to mask misalignment.

FIG. 6A is a plan view illustrating a result of the pixel electrode PE, the connection electrode 144, the first extension portion 701, the second extension portion 702, and the third extension portion 703, illustrated in FIG. 5, being shifted leftwards due to mask misalignment. In such an exemplary embodiment, the shifted distance may be about 3 μm.

As illustrated in FIG. 6A, in a case where the pixel electrode PE, the connection electrode 144, the first extension portion 701, the second extension portion 702, and the third extension portion 703 are shifted leftwards, the distance d1 between the second data line DL2 and the pixel electrode PE increases, whereas the distance d2 between the second data line DL2 and the second extension portion 702 decreases in proportion to the increase (an increase of the distance d1). In other words, as the distance d1 increases, the distance d2 decreases. Accordingly, the first capacitor C1 of FIG. 6A has a lower capacitance than a capacitance of the first capacitor C1 of FIG. 5, while the second capacitor C2 of FIG. 6A has a greater capacitance than a capacitance of the second capacitor C2 of FIG. 5. In such an exemplary embodiment, as the capacitance of the first capacitor C1 decreases, the capacitance of the second capacitor C2 increases in proportion to the decrease, and thus, a total capacitance (hereinafter, a first total capacitance) of the capacitance of the first capacitor C1 and the capacitance of the second capacitor C2 in FIG. 5 is substantially the same as a total capacitance (hereinafter, a second total capacitance) of the capacitance of the first capacitor C1 and the capacitance of the second capacitor C2 in FIG. 6A. In other words, the capacitance of the first capacitor C1 and the capacitance of the second capacitor C2 are in a trade-off relationship, and thus, although respective capacitances of the first and second capacitors C1 and C2 may vary, the total capacitance may remain constant. Accordingly, although the pixel electrode PE, the connection electrode 144, the first extension portion 701, the second extension portion 702, and the third extension portion 703 are shifted leftwards as illustrated in FIG. 6A, the second total capacitance may be substantially the same as the first total capacitance.

In addition, the capacitance of the third capacitor C3 of FIG. 6A is substantially the same as the capacitance of the third capacitor C3 of FIG. 5. This is because an overlapping area (hereinafter, a first overlapping area) between the third extension portion 703 and the first data line DL1 in FIG. 5 is substantially the same as an overlapping area (hereinafter, a second overlapping area) between the third extension portion 703 and the first data line DL1 in FIG. 6A. That is, because the third extension portion 703 has a sufficiently larger area than a line width of the first data line DL1, although the third extension portion 703 is shifted leftwards, the first overlapping area and the second overlapping area may be substantially the same. Accordingly, although the pixel electrode PE, the connection electrode 144, the first extension portion 701, the second extension portion 702, and the third extension portion 703 are shifted leftwards as illustrated in FIG. 6A, the third capacitor C3 of FIG. 6A may have substantially the same capacitance as a capacitance of the third capacitor C3 of FIG. 5.

Figure 6B:
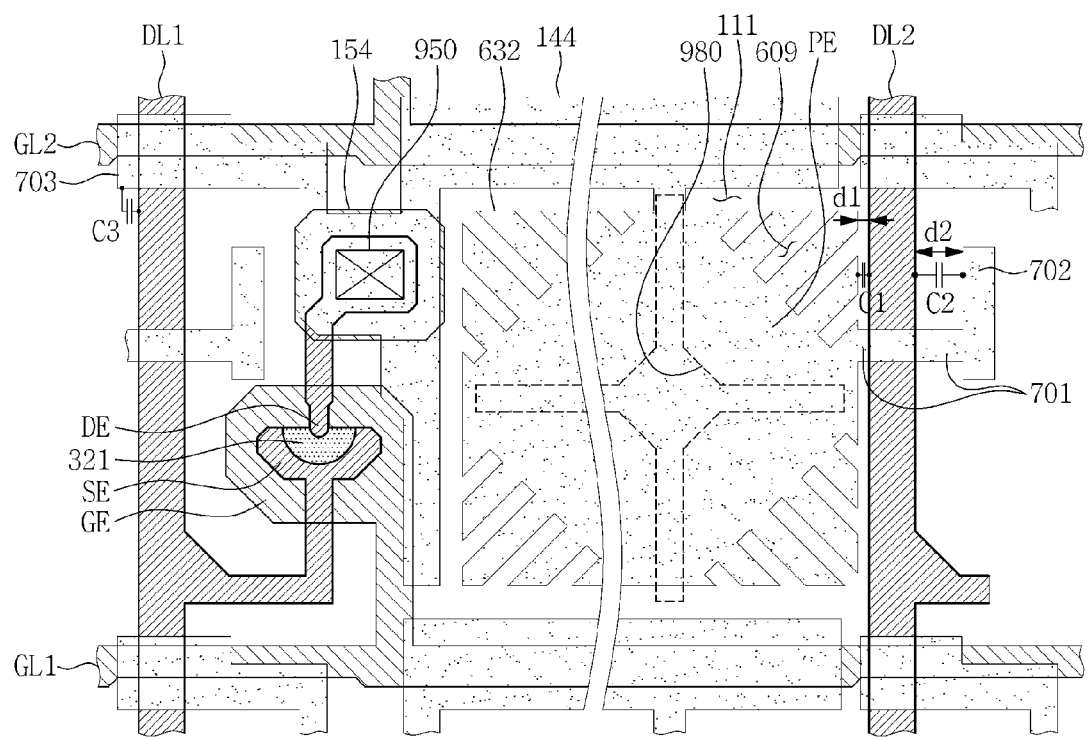
FIG. 6B is a plan view illustrating a result of the pixel electrode, the connection electrode, the first extension portion, the second extension portion, and the third extension portion, illustrated in FIG. 5, being shifted rightwards due to mask misalignment.

FIG. 6B is a plan view illustrating a result of the pixel electrode PE, the connection electrode 144, the first extension portion 701, the second extension portion 702, and the third extension portion 703, illustrated in FIG. 5, being shifted rightwards due to mask misalignment. In such an exemplary embodiment, a shifted distance may be about 3 μm.

As illustrated in FIG. 6B, in a case where the pixel electrode PE, the connection electrode 144, the first extension portion 701, the second extension portion 702, and the third extension portion 703 are shifted rightwards, the distance d1 between the second data line DL2 and the pixel electrode PE decreases, whereas the distance d2 between the second data line DL2 and the second extension portion 702 increases in proportion to the decrease (a decrease of the distance d1). In other words, as the distance d1 decreases, the distance d2 increases. Accordingly, the first capacitor C1 of FIG. 6B has a greater capacitance than a capacitance of the first capacitor C1 of FIG. 5, while the second capacitor C2 of FIG. 6B has a less capacitance than a capacitance of the second capacitor C2 of FIG. 5. In such an exemplary embodiment, as the capacitance of the first capacitor C1 increases, the capacitance of the second capacitor C2 decreases in proportion to the increase, and thus the total capacitance (i.e., the first total capacitance) of the capacitance of the first capacitor C1 and the capacitance of the second capacitor C2 in FIG. 5 is substantially the same as a total capacitance (hereinafter, a third total capacitance) of the capacitance of the first capacitor C1 and the capacitance of the second capacitor C2 in FIG. 6B. In other words, the capacitance of the first capacitor C1 and the capacitance of the second capacitor C2 are in a trade-off relationship, and thus, although respective capacitances of the first and second capacitors C1 and C2 vary, the total capacitance of the respective capacitances may not vary. Accordingly, although the pixel electrode PE, the connection electrode 144, the first extension portion 701, the second extension portion 702, and the third extension portion 703 are shifted rightwards as illustrated in FIG. 6B, the third total capacitance may be substantially the same as the first total capacitance.

In addition, the capacitance of the third capacitor C3 of FIG. 6B may be substantially the same as the capacitance of the third capacitor C3 of FIG. 5. This is because the overlapping area (i.e., the first overlapping area) between the third extension portion 703 and the first data line DL1 in FIG. 5 is substantially the same as an overlapping area (hereinafter, a third overlapping area) between the third extension portion 703 and the first data line DL1 in FIG. 6B. That is, as the third extension portion 703 has a sufficiently larger area than a line width of the first data line DL1, although the third extension portion 703 is shifted rightwards, the first overlapping area and the third overlapping area may be substantially the same. Accordingly, although the pixel electrode PE, the connection electrode 144, the first extension portion 701, the second extension portion 702, and the third extension portion 703 are shifted rightwards as illustrated in FIG. 6B, the third capacitor C3 of FIG. 6B may have substantially a same capacitance as a capacitance of the third capacitor C3 of FIG. 5.

In an exemplary embodiment, the first total capacitance, the second total capacitance, and the third total capacitance are substantially the same. In addition, the first overlapping area, the second overlapping area, and the third overlapping area are substantially the same. Accordingly, the capacitance of the third capacitor of FIG. 5, the capacitance of the third capacitor of FIG. 6A, and the capacitance of the third capacitor of FIG. 6B are substantially the same.

As such, although the pixel electrode PE, the connection electrode 144, the first extension portion 701, the second extension portion 702, and the third extension portion 703 are shifted leftwards or rightwards due to the mask misalignment, a total capacitance of the first, second, and third capacitors C1, C2, and C3 of the pixel may be maintained substantially uniform. Accordingly, degradation of image quality due to the mask misalignment may be significantly reduced.

Figure 7:
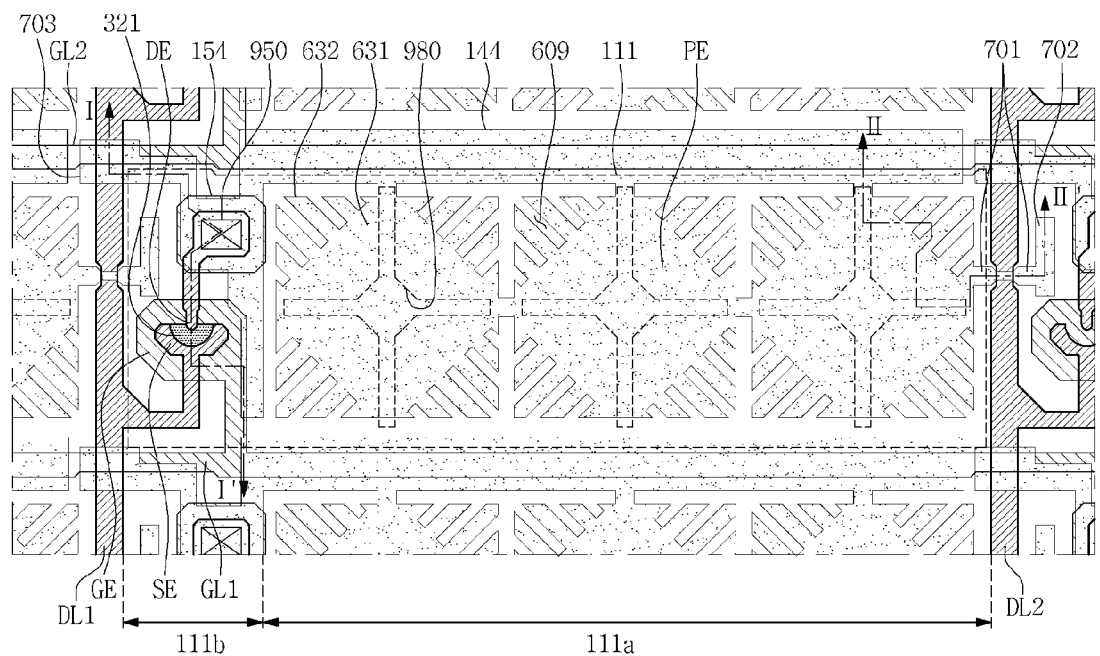
FIG. 7 is a plan view illustrating another exemplary embodiment of a display device.

FIG. 7 is a plan view illustrating another exemplary embodiment of a display device.

As illustrated in FIG. 7, a portion of a first extension portion 701 intersecting a data line (e.g., a first data line DL1 or a second data line DL2) may have a line width less than a line width of another portion thereof, and a portion of the data line (e.g., the first data line DL1 or the second data line DL2) intersecting the first extension portion 701 may have a line width less than a line width of another portion thereof. Accordingly, a parasitic capacitance among the first extension portion 701 and the data line (e.g., the first data line DL1 or the second data line DL2) may be reduced.

Descriptions pertaining to other elements illustrated in FIG. 7 will make reference to FIGS. 1, 2, 3, and 4 and related descriptions.

Figure 8:
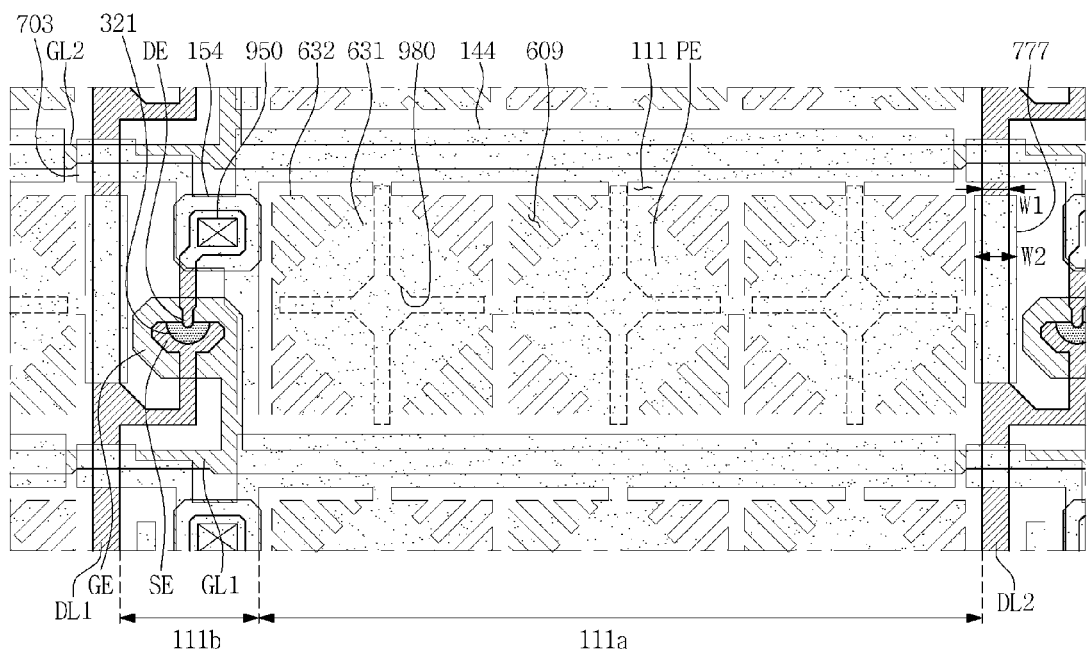
FIG. 8 is a plan view illustrating still another exemplary embodiment of a display device.

FIG. 8 is a plan view illustrating still another exemplary embodiment of a display device.

As illustrated in FIG. 8, still another alternative exemplary embodiment of a display device includes a fourth extension portion 777.

The fourth extension portion 777 extends from a pixel electrode PE. The fourth extension portion 777 overlaps a second data line DL2. The fourth extension portion 777 has a greater width than a width of the second data line DL2. In other words, a width W2 of the extension portion is greater than a width W1 of the second data line DL2. The fourth extension portion 777 faces the pixel electrode PE. The fourth extension portion 777 faces a side of the pixel electrode PE, and the fourth extension portion 777 has a length less than a length of the side of the pixel electrode PE.

Other elements illustrated in FIG. 8 are substantially the same as elements illustrated in FIGS. 1, 2, and 3, and thus descriptions pertaining thereto will make reference to FIGS. 1, 2, and 3 and the related descriptions.

Figure 9:
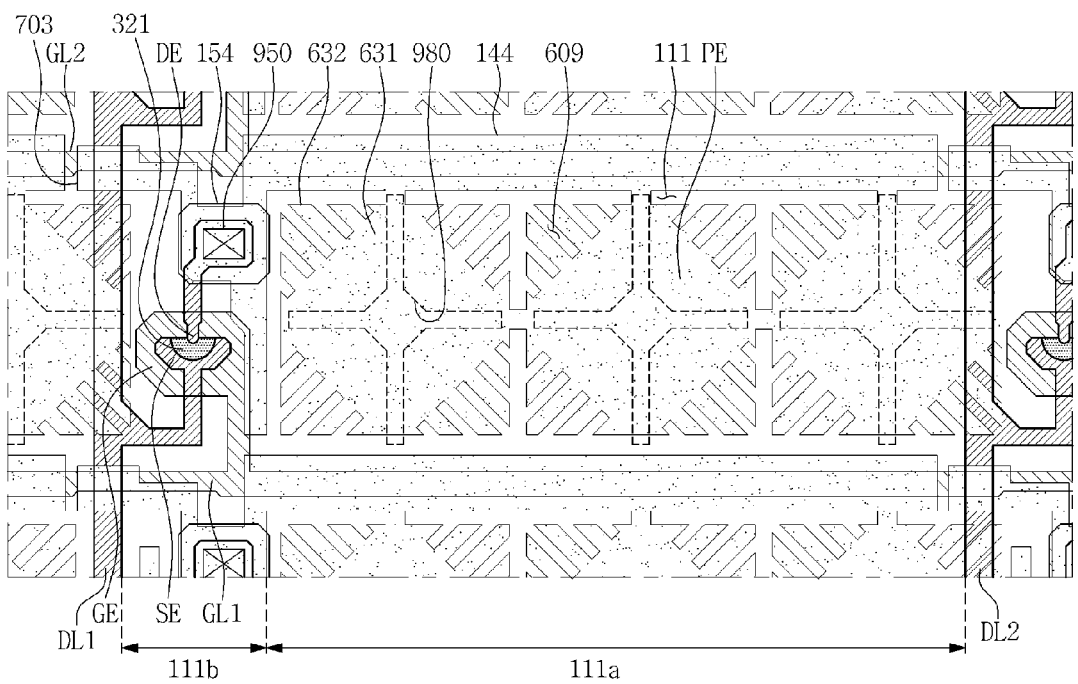
FIG. 9 is a plan view illustrating still another alternative exemplary embodiment of a display device.

FIG. 9 is a plan view illustrating still another exemplary embodiment of a display device.

As illustrated in FIG. 9, still another exemplary embodiment of a display device includes a pixel electrode PE overlapping a second data line DL2.

The pixel electrode PE of FIG. 9 includes a planar electrode 631 and a branch electrode 632 described hereinabove. In a case where a pixel includes a plurality of planar electrodes 631, a rightmost one of the plurality of planar electrodes 631 (hereinafter, an outermost planar electrode) overlaps the second data line DL2. In such an exemplary embodiment, at least one of branch electrodes 632 extending from the outermost planar electrode overlaps the second data line DL2.

In addition, a hole 980 of a common electrode illustrated in FIG. 9 overlaps the second data line DL2.

As set forth above, according to one or more exemplary embodiments, a display device may provide the following effects.

First, capacitance variation of a capacitor formed by a pixel electrode and a data line may be significantly reduced (e.g., minimized).

Second, a signal delay of the data line may be significantly reduced (e.g., minimized).

Third, an aperture ratio of a pixel may be increased.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device, comprising:
 a first gate line;
 first and second data lines intersecting the first gate line;
 a pixel electrode adjacent to the second data line;
 a switching element connected to the first gate line, the first data line, and the pixel electrode;
 a first extension portion extending from the pixel electrode in a first direction and intersecting the second data line; and
 a second extension portion extending from the first extension portion in a second direction perpendicular to the first direction.

2. The display device as claimed in claim 1, wherein the second extension portion is spaced apart from the second data line.

3. The display device as claimed in claim 2, wherein a first side of the second data line faces the second extension portion.

4. The display device as claimed in claim 3, wherein a second side of the second data line faces the pixel electrode.

5. The display device as claimed in claim 2, further comprising:
 a connection electrode connecting the pixel electrode and the switching element; and
 a third extension portion extending from the connection electrode and overlapping the first data line.

6. The display device as claimed in claim 5, wherein the third extension portion has a width greater than a width of the first data line.

7. The display device as claimed in claim 5, wherein a sum of a capacitance of a first capacitor formed by the pixel electrode and the second data line and a capacitance of a second capacitor formed by the second data line and the second extension portion is substantially equal to a capacitance of a third capacitor formed by the first data line and the third extension portion.

8. The display device as claimed in claim 5, wherein the pixel electrode, the connection electrode, the first extension portion, the second extension portion, and the third extension portion are integrally formed as a single structure.

9. The display device as claimed in claim 2, wherein, at an intersecting portion between the second data line and the first extension portion, at least one of the second data line and the first extension portion has a width less than a width of another portion of the at least one of the second data line and the first extension portion.

10. The display device as claimed in claim 2, wherein a distance between the pixel electrode and the second data line is the same as a distance between the second data line and the second extension portion.

11. The display device as claimed in claim 2, wherein a distance between the pixel electrode and the second data line is different from a distance between the second data line and the second extension portion.

12. The display device as claimed in claim 11, wherein the distance between the pixel electrode and the second data line is greater than the distance between the second data line and the second extension portion.

13. The display device as claimed in claim 11, wherein the distance between the pixel electrode and the second data line is less than the distance between the second data line and the second extension portion.

14. The display device as claimed in claim 1, further comprising:
 a connection electrode connecting the pixel electrode and the switching element; and
 a second gate line overlapping the connection electrode.

15. The display device as claimed in claim 14, wherein, in one frame period, the second gate line is driven before the first gate line is driven.

16. The display device as claimed in claim 14, wherein the pixel electrode is disposed in an area defined by the first gate line, the second gate line, the first data line, and the second data line.

17. The display device as claimed in claim 16, wherein:
 the pixel electrode comprises:
  a plurality of planar electrodes connected to each other in a row between the first and second gate lines; and
  a plurality of branch electrodes extending from each of the planar electrodes; and
 the first extension portion extends from one of the planar electrodes or the branch electrodes.

18. The display device as claimed in claim 17, further comprising a common electrode overlapping the pixel electrode, wherein the common electrode comprises a plurality of holes, each corresponding to one of the planar electrodes.

19. The display device as claimed in claim 18, wherein each of the holes has a cross shape.

20. The display device as claimed in claim 19, wherein:
 each of the planar electrodes comprises four sides, and a central portion of each of the holes comprises four inner walls; and
 each of the inner walls is substantially parallel to one of the sides of the planar electrodes.

21. The display device as claimed in claim 1, wherein:
 the pixel electrode comprises a planar electrode and a branch electrode extending from the planar electrode, and
 the first extension portion extends from one of the planar electrode and the branch electrode.

22. The display device as claimed in claim 21, further comprising a common electrode overlapping the pixel electrode, the common electrode comprising a hole corresponding to the planar electrode.

23. The display device as claimed in claim 22, wherein:
 the planar electrode comprises four sides, and a central portion of the hole comprises four inner walls; and
 each of the inner walls is substantially parallel to one of the sides of the planar electrode.

24. The display device as claimed in claim 1, wherein a first side of the pixel electrode facing the first gate line has a length greater than a length of a second side of the pixel electrode facing the second data line.

25. The display device as claimed in claim 1, further comprising a common electrode overlapping the pixel electrode.

26. The display device as claimed in claim 25, wherein the common electrode comprises a hole corresponding to the pixel electrode.

27. The display device as claimed in claim 26, wherein the hole has a cross shape.

\* \* \* \* \*